(12) United States Patent
Ji et al.

(10) Patent No.: US 9,899,184 B2
(45) Date of Patent: Feb. 20, 2018

(54) OPTICAL VACUUM CRYO-STAGE FOR CORRELATIVE LIGHT AND ELECTRON MICROSCOPY

(71) Applicant: INSTITUTE OF BIOPHYSICS, CHINESE ACADEMY OF SCIENCES, Beijing (CN)

(72) Inventors: Gang Ji, Beijing (CN); Shuoguo Li, Beijing (CN); Fei Sun, Beijing (CN)

(73) Assignee: Institute of Biophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/500,009

(22) PCT Filed: Jul. 22, 2015

(86) PCT No.: PCT/CN2015/084759
§ 371 (c)(1),
(2) Date: Jan. 27, 2017

(87) PCT Pub. No.: WO2016/015580
PCT Pub. Date: Feb. 4, 2016

(65) Prior Publication Data
US 2017/0271126 A1 Sep. 21, 2017

(30) Foreign Application Priority Data

Jul. 28, 2014 (CN) .......................... 2014 1 0363314

(51) Int. Cl.
*H01J 37/26* (2006.01)
*G02B 21/26* (2006.01)
*G02B 21/28* (2006.01)

(52) U.S. Cl.
CPC .............. *H01J 37/26* (2013.01); *G02B 21/26* (2013.01); *G02B 21/28* (2013.01)

(58) Field of Classification Search
CPC .......... G02B 21/26; G02B 21/28; H01J 37/26
See application file for complete search history.

(56) References Cited

U.S. PATENT DOCUMENTS

| 5,355,683 A * | 10/1994 | Taylor ...................... G01N 3/04 250/443.1 |
| 2008/0210869 A1 | 9/2008 | Gerritsen et al. |
| 2009/0230319 A1* | 9/2009 | Fujiyoshi ................ H01J 37/20 250/442.11 |

FOREIGN PATENT DOCUMENTS

| CN | 101241087 A | 8/2008 |
| CN | 103348439 A | 10/2013 |

(Continued)

OTHER PUBLICATIONS

ISA State Intellectual Property Office of the People's Republic of China, International Search Report Issued in Application No. PCT/CN2015/084759, dated Oct. 23, 2015, WIPO, 4 pages.

*Primary Examiner* — Jason McCormack
*Assistant Examiner* — Sean Luck
(74) *Attorney, Agent, or Firm* — McCoy Russell LLP

(57) ABSTRACT

An optical vacuum cryostage for correlative light and electron microscopy comprises a vacuum chamber, an anti-contamination system adapter interface, an electron microscope specimen holder adapter interface, an upper optical window, a lower optical window, a vacuum pumping system adapter interface and a vacuum valve, wherein the anti-contamination system adapter interface is arranged in one end of the vacuum chamber, the electron microscope specimen holder adapter interface is arranged in the other end of the vacuum chamber, the upper optical window is arranged on the upper wall of the vacuum chamber, the lower optical window is arranged on the lower wall of the vacuum chamber and opposite to the upper optical window.

3 Claims, 1 Drawing Sheet

(56) References Cited

FOREIGN PATENT DOCUMENTS

| | | | |
|---|---|---|---|
| CN | 104142302 | A | 11/2014 |
| EP | 2383769 | A1 | 11/2011 |
| JP | 2012038676 | A | 2/2012 |
| WO | 2016015580 | A1 | 2/2016 |

* cited by examiner

OPTICAL VACUUM CRYO-STAGE FOR CORRELATIVE LIGHT AND ELECTRON MICROSCOPY

CROSS-REFERENCE TO RELATED APPLICATIONS

The present application is a U.S. National Phase of International Patent Application Serial No. PCT/CN2015/084759, entitled "OPTICAL VACUUM COOLING STAGE FOR CORRELATIVE LIGHT AND ELECTRON MICROSCOPE IMAGING," filed on Jul. 22, 2015. International Patent Application Serial No. PCT/CN2015/084759 claims priority to Chinese Patent Application No. 201410363314.8, filed on Jul. 28, 2014. The entire contents of each of the above-cited applications are hereby incorporated by reference for all purposes.

TECHNICAL FIELD

The invention belongs to an optical imaging technical field, and in particular, relates to an optical vacuum cryo-stage for correlative light and electron microscopy.

BACKGROUND

Three-dimensional reconstruction technology of the cryo-electron microscopy and X-ray crystallography, nuclear magnetic resonance spectrometry etc. have become the most important experiment methods for researching high resolution structural biology, more and more biological macromolecule structures are resolved successively. However, the eventual goal is to reveal the mechanism of the life activities on the different scales such as the molecule, organelle, cell by resolving the structures of biological macromolecule and molecular machine in situ.

In recent years, people may directly observe the positioning and motion of the target molecules in the cell and resolve the cell ultrastructure where the target molecules are by the use of the fluorescent protein labeling technology, the fluorescent microscopy, the immuno-electron microscopy, the cryo-electron microscopy and the electron tomography. With the development of the cell biology, simultaneously, the high precise positioning and the research of the high resolution ultrastructure for the molecular machines at the same position in the same cell using the fluorescent microscopy and the electron microscopy become the powerful research means, and this technology is referred to as Correlative Light and Electron Microscopy (CLEM). The targets are labeled and positioned by the fluorescent microscopy, the three-dimensional structure of the specified site of the cell is acquired by the three-dimensional reconstruction technology of the electron microscopes, and the positioning information and the structure information are merged and processed, thereby obtaining a number of the three-dimensional structure information regarding the molecular machines in the cells in situ to statistically achieve the dynamic variation mechanisms of the target molecular mechanisms in situ.

Currently, there are mainly two kinds of ways for the hardware implementations of correlative light and electron microscopy: one is an integrated system of the light microscope and electron microscope, that is, an optical imaging module is integrated into an electron microscope. The advantages lie in that it may be achieved that the light microscope and the electron microscope in situ of the biological specimen are imaged respectively and even imaged simultaneously, the image matching of the optical imaging and the electron imaging are convenient, and the cumbersome steps for transferring specimens between the light microscope and the electron microscope and the possibly caused contamination for the specimens are avoided. However, the small space between two pole pieces of objective lens of transmission electron microscope limited the optical imaging system put in it. Thus, the working distance of the objective lens must be larger, and it is difficult to obtain high resolution fluorescent images. Further, a more flexible correlative way is independent imaging of the light microscope and the electron microscope, a cryo-stage is mounted on independent optical imaging system, cryofluorescent imaging is accomplished, and then the specimen is transferred from the cryo-stage to the cryo-electron microscope for imaging. The advantages of this correlative way are in that the light microscope and electron microscope are unlimited with respect to each other in hardware, the modes of the optical imaging are various, which facilitates to achieve the higher accuracy fluorescent positioning. However, the design scheme of the existing cryo-stage mostly uses liquid nitrogen (or low temperature nitrogen) for flow refrigeration. The drifting of the specimen caused by the liquid nitrogen shaking and damaging of the objective lens in low temperature condition are all the difficult problem of affecting popularization of this technology. Meanwhile, the damage and contamination of the freezing specimen during the light microscope imaging and the transmission to the cryo-electron microscope is also a significant challenge.

SUMMARY

For the above-mentioned problem, the object of the present invention is that a high vacuum cryo-stage for the fluorescent microscope imaging of a freezing specimen by correlative light and electron microscopy based on the existing cryo-transmission electron microscope and fluorescent microscope imaging system is provided.

In order to achieve the above-mentioned object, the invention employs the following technical solution: an optical vacuum cryo-stage for correlative light and electron microscopy comprises a vacuum chamber, an anti-contamination system adapter interface, an electron microscope specimen holder adapter interface, an upper optical window, a lower optical window, a vacuum pumping system adapter interface and a vacuum valve, wherein the anti-contamination system adapter interface is arranged in one end of the vacuum chamber, the electron microscope specimen holder adapter interface is arranged in the other end of the vacuum chamber, the upper optical window is arranged on the upper wall of the vacuum chamber, the lower optical window is arranged on the lower wall of the vacuum chamber and opposite to the upper optical window, the vacuum pumping system adapter interface is arranged in one side of the vacuum chamber, and the vacuum valve is arranged between the electron microscope specimen holder adapter interface and the upper and lower optical windows; a forvacuum channel is formed between the vacuum valve and the electron microscope specimen holder adapter interface, a forvacuum valve is arranged in one side of the forvacuum channel; vacuum seal rings are respectively arranged at the electron microscope specimen holder adapter interface, the upper optical window, the lower optical window, the vacuum pumping system adapter interface and the anti-contamination system adapter interface.

An anti-contamination system is also included, comprising: a heat conductive rod extended into the vacuum chamber 1 by a portion of the anti-contamination system adapter interface, a metal cryobox connected to one end where the heat conductive rod is positioned inside the vacuum chamber, a heat conductive wire connected to one end where the heat conductive rod is positioned outside the vacuum chamber, and a Dewar; wherein the metal cryobox is opposite to the position of the upper, lower optical window, and a pair of holes are oppositely arranged at the upper, lower surfaces of the metal cryobox; a liquid nitrogen chamber filled with the liquid nitrogen is formed inside of the Dewar, and the heat conductive wire is arranged into the liquid nitrogen chamber.

The heat conductive rod, the metal cryobox and the heat conductive wire are made of the red copper or the silver.

The invention has the following advantages due to the above technical solution: 1. the invention provides an optical vacuum cryostage which can be adapted with transmission electron microscope cryoholder, which creates a vacuum environment for the freezing specimen, such that the freezing specimen may be transferred into the transmission electron microscope fast for imaging after it completes the optical imaging in the optical vacuum cryostage. Because the invention replaces the liquid nitrogen (or the low temperature nitrogen) of the cryostage in the art with the vacuum environment for refrigeration, the cryostage in this invention can effectively avoid drifting of the specimen caused by liquid nitrogen (or nitrogen) shaking and damaging of the objective lens in the ultra-low temperature condition, and this invention does not need to directly touch the specimen during the transferring process, which may effectively avoid the deformation of the support grid, ice contamination and movement of the specimen position in the process of gripping specimen. 2. The invention also provides a set of anti-contamination system which may maintain a low temperature environment surrounding the freezing specimen for adsorbing and condensing the contamination in vacuum chamber in the process of the optical imaging, thereby may effectively solve the contamination problem of the freezing specimen during the optical imaging process for long time. 3. The invention maybe conveniently installed on the different types of the optical microscope (not only commonly inverted or upright fluorescent microscopes, but also for the photo activated locatization super-resolution fluorescence microscopy and so on) by a stage adapter, and may achieve the optical objective lens externally arranged operating mode, the objective lens semi-embedded operating mode or the objective lens fully-embedded operating mode, to adapt to the different operating distances of the optical objective lens imaging according to the experiment requirement. 4. The electron microscope specimen holder adapter interface which the invention relates to may be applied to the different types of transmission electron microscope specimen holder, even extended to a scanning electron microscope, by adjusting of the appropriating size and shape. The invention may be widely applied to the field of the correlative light and electron microscopy, also may be individually applied to the optical microscope imaging, which may match up different types of the specimen holder to achieve imaging in the different conditions such as low temperature, high temperature, atmosphere, liquid condition, etc.

BRIEF DESCRIPTION OF THE DRAWINGS

The present invention is described in detail in conjunction with the accompanying drawings. However, it should be understood that the provided drawings are only for purposes of better understanding the present invention, and are not intended to limit to the present invention.

Wherein FIG. 2 (*a*) represents the semi-embedded connection relationship of the objective lens with the invention; FIG. 2 (*b*) represents the fully-embedded connection relationship of the objective lens with the invention.

DETAILED DESCRIPTION

Embodiment 1

Figure 1:
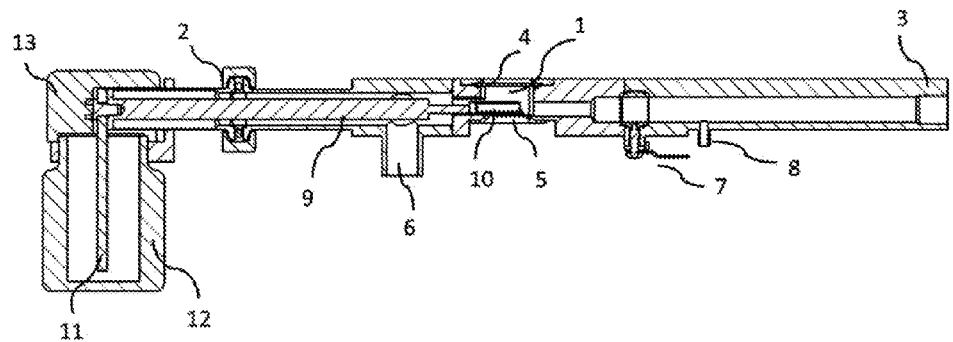
FIG. 1 is a schematic diagram of overall structure of the present invention.

As shown in FIG. 1, the embodiment comprises a vacuum chamber 1, an anti-contamination system adapter interface 2 is arranged in one end of the vacuum chamber 1, and an electron microscope specimen holder adapter interface 3 is arranged in the other end of the vacuum chamber. An upper optical window 4 and a lower optical window 5 are oppositely arranged on both of the upper, lower walls of the vacuum chamber 1 which may be connected to the vacuum chamber 1 by the connection way of fixed bolt to facilitate disassembly. A vacuum pumping system adapter interface 6 is arranged in one side of the vacuum chamber 1, which is used to connect a set of vacuum pumps extracting vacuum for the vacuum chamber 1. A vacuum valve 7 is arranged in the vacuum chamber 1 located between the electron microscope specimen holder adapter interface 3 and the upper and lower optical windows 4, 5, a forvacuum channel is formed between the vacuum valve 7 and the electron microscope specimen holder adapter interface 3, and a forvacuum valve 8 is arranged in one side of the forvacuum channel, which is used to connect the lower-grade set of vacuum pump.

In this embodiment, the vacuum seal rings are respectively arranged at the electron microscope specimen holder adapter interface 3, the upper optical window 4, the lower optical window 5, the vacuum system adapter interface 6 and the anti-contamination system adapter interface 2 (the arrangement way is a customary means in the art) to ensure that the whole system maintains a constant vacuum degree in the operating process.

The optical vacuum cryostage of the embodiment when used may be carried out as described below.

1. The optical vacuum cryostage of the embodiment is installed on an stage of inverted fluorescent microscope (e.g. Olympus IX73 etc.) by the adapter, and a long working distance optical objective lens (e.g. LUCPLFLN 40X) is selected for fluorescent imaging; Meanwhile, the anti-contamination system adapter interface 2 is directly sealed using a vacuum flange, and the vacuum pumping system adapter interface 6 is connected to the set of vacuum pumps.

2. After installed, firstly, the vacuum valve 7 of the vacuum chamber 1 is closed, and then the set of vacuum pumps is initiated for extracting vacuum for the vacuum chamber 1, until the pressure in the vacuum chamber 1 is extracted to a prescribed value (usually better than $5*10^{-3}$ Pa).

3. The electron microscope cryospecimen holder with the freezing specimen is inserted to the electron microscope specimen holder adapter interface 3, and the forvacuum valve 8 and the lower-grade set of vacuum pump which is connected to it are opened for pre-extracting the vacuum for the forvacuum channel. When the pressure in the forvacuum channel is better than the setting value (usually batter than 1 Pa), the forvacuum valve 8 is closed, and the vacuum valve 7 is opened. The electron microscope cryospecimen holder is completely pushed in the vacuum chamber 1, which ensures that the sample is positioned between the upper, the downer optical windows 4, 5, and waits that the pressure in the vacuum chamber 1 is reached to the prescribed value.

4. After the pressure in the vacuum chamber 1 is reached, a metal shutter on the electron microscope cryoholder is opened, and then can perform the observing and imaging for the fluorescent microscope.

5. After the optical imaging is done, the metal shutter on the electron microscope cryoholder is closed. The electron microscope cryo holder is pulled to the headmost end and out of the vacuum valve 7. The vacuum valve 7 is closed, and the electron microscope cryoholder is continued to be pulled until it can be completely withdrawn from the electron microscope cryoholder adapter interface 3 and transferred into the transmission electron microscope. According to the fluorescent image obtained by the fluorescent microscope, the interested target area is selected for the electron microscope imaging, thereby obtaining the correlative light and electron microscope imaging data.

Embodiment 2

As shown in FIG. 1, on the basis of Embodiment 1, this embodiment also comprises an anti-contamination system, comprising: a heat conductive rod 9 extended into the vacuum chamber 1 by a portion of the anti-contamination system adapter interface 2; A metal cryobox 10 connected to one end where the heat conductive rod 9 is positioned inside the vacuum chamber, and the metal cryobox 10 is opposite to the position of the upper, lower optical windows 4, 5, and a pair of holes are oppositely arranged at the upper, lower surfaces of the metal cryobox 10 (not shown in Figures). A heat conductive wire 11 connected to one end where the heat conductive rod 9 is positioned outside the vacuum chamber 1. The anti-contamination system also comprises a Dewar 12, a liquid nitrogen chamber filled with the liquid nitrogen is formed inside of the Dewar 12 and the liquid nitrogen chamber opening is covered by a liquid nitrogen chamber lid 13, and the heat conductive wire 11 is arranged into the liquid nitrogen chamber 13.

The heat conductive rod 9, the metal cryobox 10 and the heat conductive wire 11 in the embodiment are made of the red copper or the silver.

The optical vacuum cryostage in the embodiment is different from Embodiment 1 in the using process, which lies in that:

In the step 1, because the anti-contamination system is installed, the anti-contamination system adapter interface 2 of the optical vacuum cryostage does not employ the direct seal; In the step 3, after the electron microscope cryoholder is fully pushed into the vacuum chamber 1, it should ensure that the specimen is positioned in the metal cryobox 10. In this way, in the light microscope observation, the metal cryobox 10 is covered around the specimen, adsorb the contamination in the vacuum chamber 1, and avoid the specimen to suffer the contamination in the imaging process.

Two operating modes in which the optical microscope vacuum cryostage of this invention may be achieved, comprising:

1. When the distance from the specimen to the lower surface of the lower optical window 5 may be satisfied with the working distance of the optical objective lens, the objective lens is external (as shown in FIG. 1).

Figure 2:
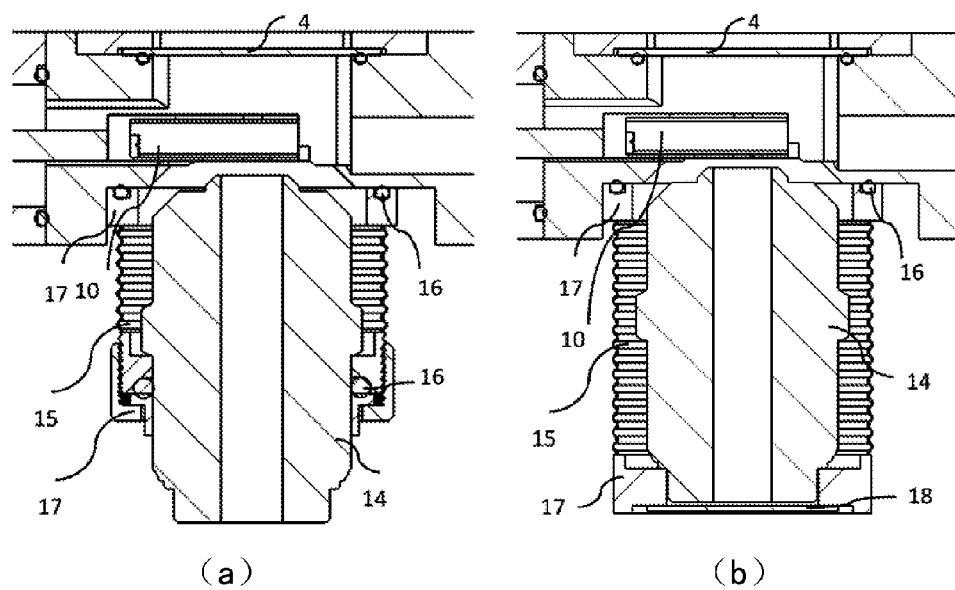
FIG. 2 is the schematic diagrams of two structures in an objective lens internally arranged operating mode of the present invention.

2. When the distance from the specimen to the external surface of the lower optical window 5 may not be satisfied with the working distance of the optical objective lens, the lower optical window 5 is needed to be removed, meanwhile, the optical lens 14 is installed at the position where the original lower optical window 5 is located by a soft bellows 15, the vacuum seal rings 16, a sealing fixed clamp 17, causing the upper end of the objective lens to position into the vacuum chamber 1. The lower end of the optical lens 14 (in this way, the lens should ensure a good vacuum sealability) may be in the atmospheric environment (as shown in FIG. 2 (*a*)) in the original way, and also install a light transmission slice 18, causing the whole objective lens to be completely sealed into the vacuum environment (as shown in FIG. 2 (*b*)). The former is referred to as be semi-embedded, the latter is referred to as be fully-embedded. As such, it can be ensured that the distance between the specimen and the optical objective lens 14 is satisfied with the imaging condition. Moreover, the bellows is softly connected between the optical lens 14 and the cryostage, which does not affect the relative movement between the objective lens and the specimen in the imaging process.

The above-mentioned embodiments are only used for further describing in detail the purposes, technical solutions and beneficial effects of the invention, and are not used to limit the invention. Any modifications, variations and improvement should be included within the scope of the protection of the present invention without departing from the spirit and principle of the present invention.

The invention claimed is:

1. An optical vacuum cryostage for correlative light and electron microscopy, comprising:
    a vacuum chamber,
    an anti-contamination system adapter interface arranged in one end of the vacuum chamber,
    an electron microscope specimen holder adapter interface arranged in the other end of the vacuum chamber,
    an upper optical window arranged on the upper wall of the vacuum chamber,
    a lower optical window arranged on the lower wall of the vacuum chamber and opposite to the upper optical window,
    a vacuum pumping system adapter interface arranged in one side of the vacuum chamber, and
    a vacuum valve arranged between the electron microscope specimen holder adapter interface and the upper and lower optical windows;
    wherein a forvacuum channel is formed between the vacuum valve and the electron microscope cryoholder adapter interface, and
    a forvacuum valve is arranged in one side of the forvacuum channel; vacuum seal rings are respectively arranged at the electron microscope cryoholder adapter interface, the upper optical window, the lower optical window, the vacuum system adapter interface and the anti-contamination system adapter interface.

2. The optical vacuum cryostage for correlative light and electron microscopy of claim 1, further comprising an anti-contamination system, the anti-contamination system comprising:
    a heat conductive rode extended into the vacuum chamber by a portion of the anti-contamination system adapter interface,
    a metal cryobox connected to one end where the heat conductive rod is positioned inside the vacuum chamber, a heat conductive wire connected to one end where the heat conductive rod is positioned outside the vacuum chamber, and a Dewar;

wherein the metal cryobox is opposite to the position of the upper, lower optical window, and a pair of holes are oppositely arranged at the upper, lower surfaces of the metal cryobox; a liquid nitrogen chamber filled with the liquid nitrogen is formed inside of the Dewar, and the heat conductive wire is arranged into the liquid nitrogen chamber.

3. The optical vacuum cryostage for correlative light and electron microscopy of claim 2, wherein the heat conductive rod, the metal cryobox and the heat conductive wire are made of the red copper or the silver.

* * * * *